(12) United States Patent
Elliott et al.

(10) Patent No.: US 7,294,570 B2
(45) Date of Patent: *Nov. 13, 2007

(54) CONTACT INTEGRATION METHOD

(75) Inventors: Richard L. Elliott, Meridian, ID (US); Guy F. Hudson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

This patent is subject to a terminal disclaimer.

(21) Appl. No.: 10/812,117

(22) Filed: Mar. 29, 2004

(65) Prior Publication Data

US 2004/0180535 A1 Sep. 16, 2004

Related U.S. Application Data

(62) Division of application No. 09/007,949, filed on Jan. 16, 1998, now Pat. No. 6,713,384, which is a division of application No. 08/811,124, filed on Mar. 3, 1997, now Pat. No. 6,593,657.

(51) Int. Cl.
*H01L 21/44* (2006.01)

(52) U.S. Cl. .................. 438/653; 438/655; 438/660; 438/664; 257/751; 257/752; 257/757; 257/765; 257/E21.577; 257/E21.584; 257/E21.585

(58) Field of Classification Search ............... 438/653, 438/655, 660, 664; 257/751, 752, 757, 765, 257/E21.584, E21.585
See application file for complete search history.

(56) References Cited

U.S. PATENT DOCUMENTS

| | | | |
|---|---|---|---|
| 3,451,871 A | * | 6/1969 | Zeppelzauer et al. .. 156/244.16 |
| 4,121,241 A | | 10/1978 | Drake et al. |
| 4,206,472 A | | 6/1980 | Chu et al. |
| 4,901,133 A | | 2/1990 | Curran et al. |

(Continued)

FOREIGN PATENT DOCUMENTS

GB 2169446 A 7/1986

*Primary Examiner*—Michael Lebentritt
*Assistant Examiner*—Ron Pompey
(74) *Attorney, Agent, or Firm*—TraskBritt

(57) ABSTRACT

A method of making a contact plug and a metallization line structure is disclosed in which a substrate is provided with at least one contact hole within an insulation layer situated on a semiconductor substrate of a semiconductor wafer. A first metal layer is deposited upon the semiconductor wafer within the contact hole. A planarizing step isolates the first metal layer within the insulation layer in the form of a contact plug within the contact hole. A second metal layer is then deposited upon the semiconductor wafer over and upon the contact plug. Metallization lines are patterned and etched from the second metal layer. The contact hole may also be lined with a refractory metal nitride layer, with a refractory metal silicide interface being formed at the bottom of the contact hole as an interface between the contact plug and a silicon layer on the semiconductor substrate. Article qualities are achieved by the inventive method, including reduced interfacial resistance and its consequent faster signal speed for the structure, reduced metal creep where additional selected alloys are allowed to diffuse a selected quantity of preferred alloying elements from the first metal layer to the second metal layer, improved depth-of-focus requirements for patterning metallization lines, and resistance of electromigration in aluminum metallization lines.

17 Claims, 4 Drawing Sheets

U.S. PATENT DOCUMENTS

| | | |
|---|---|---|
| 4,910,580 A | 3/1990 | Kuecher et al. |
| 4,926,237 A | 5/1990 | Sun et al. |
| 5,244,534 A | 9/1993 | Yu et al. |
| 5,254,872 A | 10/1993 | Yoda et al. |
| 5,266,835 A | 11/1993 | Kulkarni |
| 5,355,020 A | 10/1994 | Lee et al. |
| 5,580,821 A | 12/1996 | Mathews et al. |
| 5,644,166 A | 7/1997 | Honeycutt et al. |
| 5,719,083 A * | 2/1998 | Komatsu ............... 438/652 |
| 5,840,623 A * | 11/1998 | Sahota ................. 438/624 |
| 6,190,911 B1 * | 2/2001 | Gofuku ................ 435/365 |

* cited by examiner

CONTACT INTEGRATION METHOD

This is a divisional of U.S. application Ser. No. 09/007,949, filed on Jan. 16, 1998, now U.S. Pat. No. 6,713,384, issued Mar. 30, 2004, which is a divisional of U.S. application Ser. No. 08/811,124, filed on Mar. 3, 1997, now U.S. Pat. No. 6,593,657, issued Jul. 15, 2003.

BACKGROUND OF THE INVENTION

1. The Field of the Invention

The present invention relates to methods of making a plug and metallization line structure in microelectronic devices. More particularly, the present invention relates to methods of minimizing resistance in the interface between plugs or contacts and the metallization lines connected to them. The present invention is also particularly drawn to methods of minimizing electromigration due to minimized interface resistance and selected alloying. The present invention is also drawn to improving depth-of-focus restrictions in the process of connecting plugs or contacts to metallization lines.

2. The Relevant Technology

The process of forming contacts in semiconductors and the subsequent wiring of those contacts have several technical obstacles. These obstacles arise during fabrication and may be due to the use of differing materials. Some obstacles include depth-of-focus photolithographic problems, dissimilar metal-metal interface problems, electromigration problems, and irregular or large grain formation problems.

One technical obstacle is depth-of-focus photolithographic requirements in metallization line formation. Formation of metallization lines follows contact plug formation. During contact plug formation, a metallization line used to form the plug may have a non-planar and irregular surface above the contact hole where the plug is to be formed. The non-planarity of the metallization layer is due to the use of a portion of the metallization material that is needed to fill up the contact hole. Non-planarity, and the rough topography of the metallization layer, causes depth of focus problems in subsequent photolithography steps. These problems cause irregular metallization line widths that lead to unpredictable resistances along the metallization lines, as well as unreliable device speeds.

The problem of a rough surface can be ameliorated by reflow methods, but even with reflow, there remains an uneven surface topography.

Another technical obstacle is resistance in metal-to-metal interfaces between plug and metallization line. This obstacle arises when two disparate metals make up the plug and metallization line, respectively, or even when two metals of the same composition are poorly interfaced. The process of forming contacts in semiconductors and the subsequent wiring of those contacts to form a completed integrated circuit conventionally comprises two steps. The first step comprises forming titanium or tungsten plugs that are filled into contact holes by such methods as cold or hot deposition, cold-slow, or hot-fast force filling, or metal reflow into the contact holes, followed by an etchback that leaves only titanium or tungsten plugs isolated in the underlying silicon substrate. The second step comprises forming a metallization line over the plugs.

Electrical conduction at the titanium or tungsten interface with the metallization line can be poor in that a completely connected interface area is difficult to substantially achieve, particularly where dissimilar metals are involved. Because resistance in electrical conduction is a function of cross-sectional area through a conductive body, a less than completely connected interface between plug and metallization line causes a higher resistance than that contemplated by the design geometries of the plug-to-metallization line surface area interface. In addition to incomplete interfacial contact, filling contact holes with titanium or tungsten requires high temperatures and pressures that cause large or irregular grain structures to grow. These large or irregular grain structures resist flow and etchback and do not conduct current as well as fine-grained structures.

Still other technical obstacles are electromigration and metal creep. These involve the transport of metal atoms opposite the direction of electron flow in the lines, and can lead to failure of the lines.

Al—Cu electromigration in a structure with Al—Cu metallization lines and Ti or W plugs is well established. The phenomenon occurs because Cu diffusivity through Ti or W is much lower than through Al. Therefore, the Cu is depleted from the area of the Ti or W plug by the current flow and not replaced, leading to failure at the interface between the Ti or W plug and the Al-Cu metallization lines.

Metal creep, on the other hand, occurs due to the differences in the thermal coefficients of expansion between metals, insulators, and silicon wafers. The differences in thermal coefficients of expansion can build up stress in the metallization lines, which can lead to migration of atoms in the metallization line to the various areas of high stress and strain. This migration of atoms forms voids or vacancies in the metallization line that can cause creep failure. Additional solutions that can control both the electromigration and metal creep problems are desirable.

Yet another technical obstacle involves large or irregular grain growth during the formation of metallization lines. Large or irregular grain growth can be caused by high processing temperatures, a high contact channel density in a dielectric substrate, and the interfaces between disparate metals. For example, where a wetting surface layer is placed upon a substrate to assist in metal flow, interaction between the wetting surface layer and the metallization material can result in large or irregular grain growth.

In the case of a titanium or titanium nitride wetting surface layer, an aluminum metallization layer can react with the wetting surface layer to cause titanium aluminide intermetallic combinations that have large grain cluster formations. Large grain structures adversely affect reflow capabilities and resist planarization. Such adverse effects prevent proper plug filling and the result is poor electrical conductivity and slower and less reliable devices.

SUMMARY OF THE INVENTION

The present invention is drawn to methods of making a semiconductor substrate having thereon plug or contact connections to metallization lines, which methods minimize electrical resistance, relieve depth-of-focus restrictions during patterning of the metallization lines, and resist electromigration and creep failure between the plug or contact and the metallization line. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

A first method of the present invention comprises patterning a contact hole within an insulation layer situated on a semiconductor substrate or equivalent. The contact hole can be for a via, interconnect, or bit line. A first metal layer is then formed upon the insulation layer. If necessary for complete filling of the contact hole, additional steps are carried out by such methods as reflow or pressure fill. The first metal layer is then planarized to isolate a plug of the first metal layer in the contact hole within the insulation layer. After isolating the plug in the contact hole, a second metal layer is formed upon the insulation layer over and on an exposed end of the isolated plug. The second metal layer may then be planarized to a preferred thickness so as to render the same with a photo-notching resistant surface that alleviates stringent depth-of-focus requirements in forming metallization lines. Finally, metallization lines are patterned out of the second metal layer. The first and second metal layers can be composed of either a substantially pure metal or an alloy thereof.

The present invention is drawn to methods of making a semiconductor substrate having thereon plug or contact connections to metallization lines, which methods minimize electrical resistance, relieve depth-of-focus restrictions during patterning of the metallization lines, and resist electromigration and creep failure between the plug or contact and the metallization line. In the context of this document, the term "semiconductor substrate" is defined to mean any construction comprising semiconductive material, including, but not limited to, bulk semiconductive material such as a semiconductive wafer, either alone or in assemblies comprising other materials thereon, and semiconductive material layers, either alone or in assemblies comprising other materials. The term "substrate" refers to any supporting structure including, but not limited to the semiconductor substrates described above.

A first method of the present invention comprises patterning a contact hole within an insulation layer situated on a semiconductor substrate or equivalent. The contact hole can be for a via, interconnect, or bit line. A first metal layer is then formed upon the insulation layer. If necessary for complete filling of the contact hole, additional steps are carried out by such methods as reflow or pressure fill. The first metal layer is then planarized to isolate a plug of the first metal layer in the contact hole within the insulation layer. After isolating the plug in the contact hole, a second metal layer is formed upon the insulation layer over and on an exposed end of the isolated plug. The second metal layer may then be planarized to a preferred thickness so as to render the same with a photo-notching resistant surface that alleviates stringent depth-of-focus requirements in forming metallization lines. Finally, metallization lines are patterned out of the second metal layer. The first and second metal layers can be composed of either a substantially pure metal or an alloy thereof.

A second method of the present invention comprises patterning a contact hole within an insulation layer situated on a substrate assembly or equivalent. A single layer of metal is then formed upon the insulation layer. If necessary for complete filling of the contact hole, additional steps are carried out by such methods as reflow or pressure fill. The single layer of metal is then planarized above the insulation layer to a thickness that is preferred for metallization lines. Finally, the single layer of metal is patterned to create therefrom a unitary structure of both metallization lines and a plug isolated in the contact hole within the insulation layer. The single layer of metal can be composed of either a substantially pure metal or an alloy thereof.

A third method of the present invention comprises the same processing steps for the first metal layer. Selection of alloys of the first and second metal layers is required in the third method in which a heat treatment, after formation of the second metal layer, causes preferred metal species diffusion between the two metal layers. The preferred diffusion causes a substantially uniform concentration gradient at the interface between the first and the second metal layers that minimizes resistance, creep failure, and electromigration. The heat treatment can either precede or follow planarization of each of the first and second metal layers.

As an optional series of steps for any of the foregoing three methods, the contact hole can be filled with a plug of conductive material other than aluminum. The conductive material of which the plug is formed preferably comprises, but is not limited to, tungsten. It is also preferred that, prior to depositing the tungsten or other conductive material, a liner layer of a refractory metal nitride is first deposited. The refractory metal is deposited in an atmosphere of nitride and is subsequently annealed to serve as a barrier to prevent diffusion and chemical attack of the chemistry used to deposit the tungsten or other conductive material. The metal nitride is typically annealed to form a metal silicide at an interface with an underlying silicon substrate and to improve barrier properties of the metal nitride. The plug material is then deposited as described for one of the foregoing methods.

These and other features of the present invention will become more fully apparent from the following description and appended claims, or may be learned by the practice of the invention as set forth hereinafter.

BRIEF DESCRIPTION OF THE DRAWINGS

In order to illustrate the manner in which the above-recited and other features of the invention are obtained, a more particular description of the invention briefly described above will be rendered by reference to specific embodiments thereof that are illustrated in the appended drawings. Understanding that these drawings depict only typical embodiments of the invention and are not, therefore, to be considered limiting of its scope, the invention will be described and explained with additional specificity and detail through the use of the accompanying drawings in which.

DETAILED DESCRIPTION OF THE INVENTION

The present invention comprises methods to overcome technical challenges in the prior art and structures achieved thereby. Materials used in the present invention are preferred but are illustrative of non-limiting examples by which the present invention can be carried out with equivalent materials, either by resorting to the specification or by practicing the invention as disclosed herein.

A preferred material in the methods of the present invention is boron phosphorus silicate glass (BPSG) for an insulation layer in which a contact hole is provided. The insulation layer may also be composed of TEOS, doped silicon dioxide, BPSG, PSG, BSG, and silicon nitride, where TEOS is an oxide of silicon deposited in a chemical vapor deposition (CVD) process using a tetraethylorthosilicate precursor. The insulation layer is preferably situated on a semiconductor substrate of a semiconductor wafer. Other materials are dielectrics known in the art that are structurally sound so as to withstand processing conditions and field operating conditions. The dielectrics include, but are not limited to, oxides, nitrides, carbides, carbon nitrides, oxynitrides, and equivalents.

Metallization materials for both contact hole filling and metallization line formation can be chosen from known conductive materials. Preferred materials include aluminum and aluminum alloys of AlCu, AlSi, AlSiCu, AlTi and equivalents. Other aluminum alloys that are contemplated as consistent with the present invention include AlAg, AlAu, AlMn, AlNa, AlW, AlCuZn, AlNi and equivalents.

Because aluminum has a melting point of about 660° C., substantially lower than that of tungsten (3,370° C.) or titanium (1,800° C.), achieving ductility sufficient to cause pressure or reflow filling of the contact hole comes at significantly lower temperatures for aluminum. For example, aluminum alone has a melting point that is about 26 percent of the melting point of tungsten, about 37 percent of the melting point of copper, and about 46 percent of the melting point of silicon. Adding preferred amounts of copper- and/or silicon-alloying elements does not significantly cause the pressure fill or reflow temperatures to materially approach those required of a titanium plug fill in the contact hole (about 57 percent of tungsten) or of tungsten plug fill in the contact hole.

Figure 1:
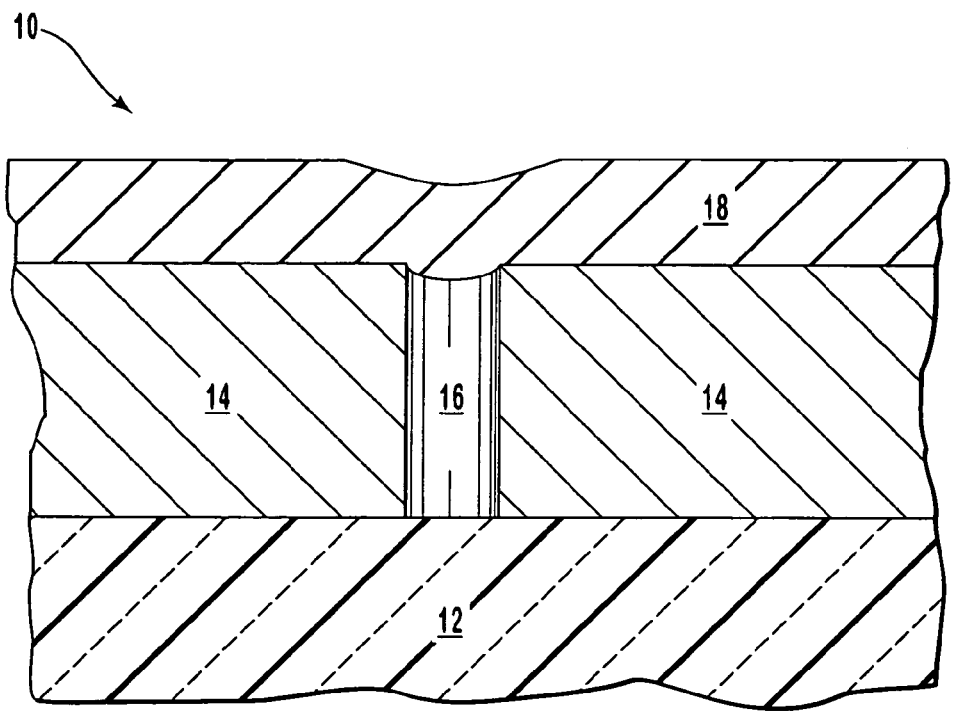
FIG. 1 is a cross-sectional view of a planarized insulation layer having therein a contact hole, the insulation layer being situated on a semiconductor substrate, and a metallization layer being disposed upon the insulation layer over the contact hole that is not filled by the metallization layer.

FIG. 1 illustrates the first step in the inventive method in which a semiconductor device 10 has an insulation layer 14 disposed upon a semi-conductive device substrate 12. A contact hole 16 has been formed, such as by patterning and etching, within insulation layer 14. Contact hole 16 exposes semiconductor substrate 12 and a first metallization layer 18 has been formed, such as by deposition, upon insulation layer 14.

Formation of first metallization layer 18 can be accomplished by physical vapor deposition (PVD), CVD, electroplating, and electroless plating. If first metallization layer 18 does not fill contact hole 16 when metallization layer 18 is formed, procedures for filling contact hole 16 are implemented. Various procedures are known to the art, such as pressure filling, reflow, and wetting layer-assisted reflow for CVD and PVD. For electroplating and electroless plating, the surface tension of the plating solution tended to resist the filling of a contact hole, particularly as the aspect ratio of the contact hole increases. As such, surfactants and/or other means of overcoming both surface tension and electrostatic charges must be employed to ensure that the contact hole is substantially completely filled.

Figure 2:
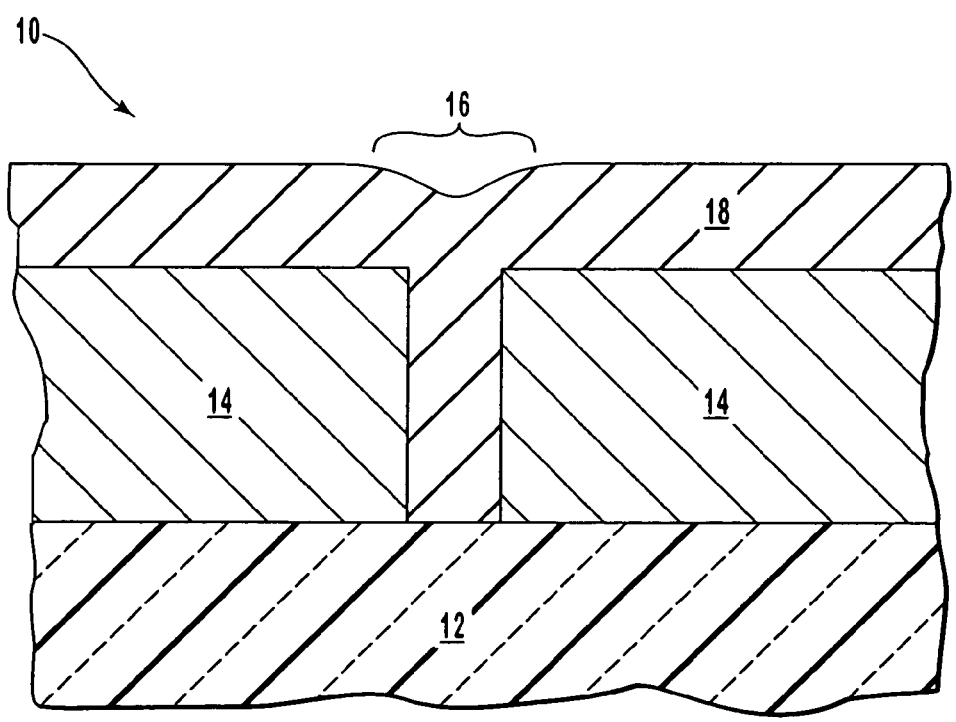
FIG. 2 is a cross-sectional view of the structure seen in FIG. 1, where the metallization layer fills the contact hole, and the metallization layer has a non-planar top surface above the insulation layer.

FIG. 2 illustrates the result of a pressure filling step in filling contact hole 16 with first metallization layer 18. A topographical depression forms in first metallization layer 18 above contact hole 16, caused by the filling of first metallization layer 18 into contact hole 16. Removal of at least some of first metallization layer 18 is next required to planarize the same. After formation of first metallization layer 18, an optional heat treatment is carried out to anneal structures of semiconductor device 10.

Figure 3:
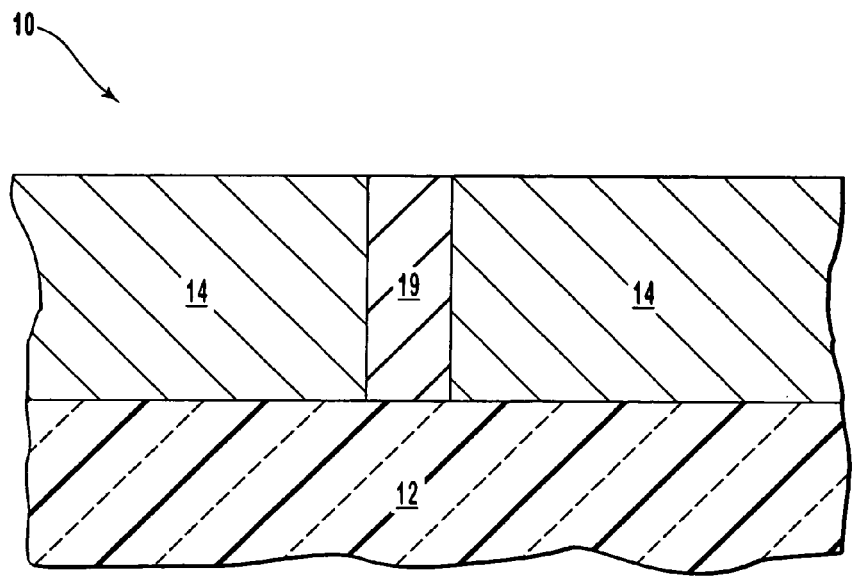
FIG. 3 is a cross-sectional view of the structure seen in FIG. 2, where the metallization layer is planarized at the top surface of the insulation layer so as to isolate within the insulation layer a plug in the contact hole.

FIG. 3 illustrates the result of a planarization step that stops on insulation layer 14. The planarizing step can be either a mechanical planarizing step of a chemical mechanical planarization step (CMP). After the planarization step, only a contact plug 19 remains of first metallization layer 18. Contact plug 19, which is isolated by insulation layer 14, fills contact hole 16. A mechanical planarization step is costly in both time and materials. Mechanical planarization also requires a cleaning step before the wafer can be advanced to the next process step. If a chemical mechanical planarization process (CMP) is used to planarize and then stop on insulation layer 14, as shown in FIG. 3, chemicals in the CMP process oxidize upper surfaces of first metallization layer 18 and abrasives therein shear away oxides of the upper surfaces of first metallization layer 18 in a repeating cycle that eventually planarizes first metallization layer 18.

Figure 4:
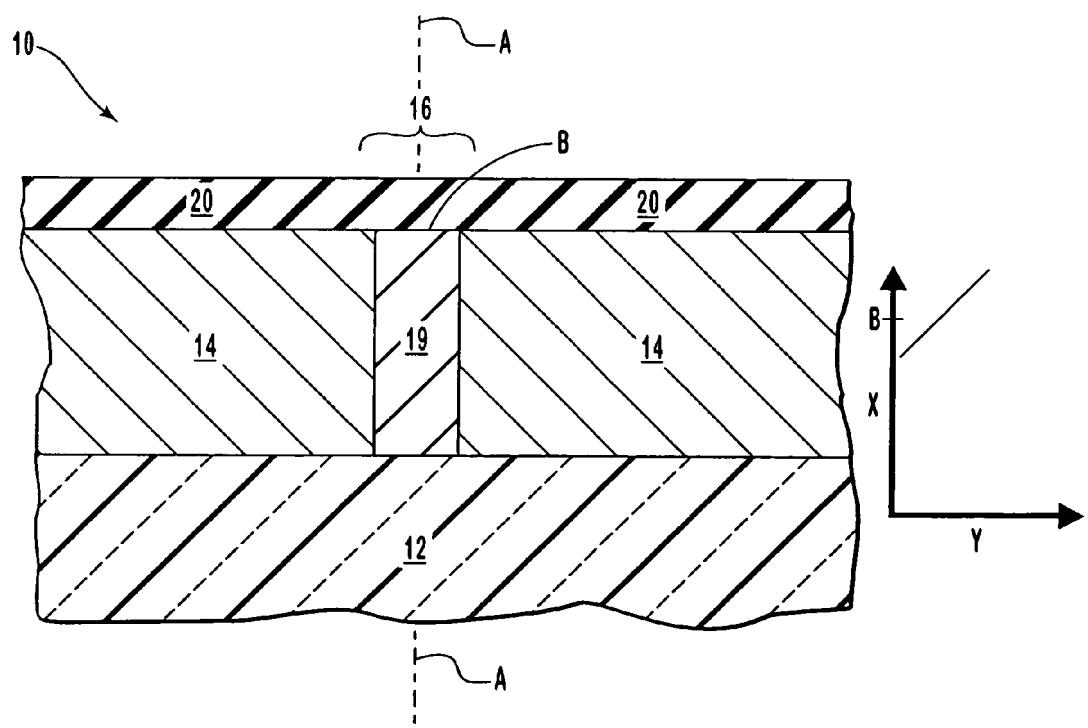
FIG. 4 is a cross-sectional view of the structure seen in FIG. 3, where a second metallization layer is formed over the insulation layer on and above the isolated plug in the contact hole, and also showing in a graphic form an optional thermal diffusion of a preferred alloying element from the second metallization layer into the first metallization layer in the contact hole.

Following planarization, a second metallization layer 20 seen in FIG. 4 is formed upon insulation layer 14. Second metallization layer 20, like first metallization layer 18, can be formed by PVD, CVD, or variations thereof. Second metallization layer 20 is formed upon an exposed end of isolated contact plug 19. A second planarization step is carried out to planarize the exposed upper surface of second metallization layer 20. This second planarization step is performed until second metallization layer 20 has a preferred metallization line thickness. Like the first planarization step, the second planarization step can be either a mechanical planarization step or a chemical mechanical planarization step.

By performing a second planarization step upon second metallization layer 20, the quality of planarity is achieved in which photolithographic restrictions upon depth-of-focus are ameliorated. Because of a planarity achieved by planarization that cannot be achieved merely by deposition, photographic notching is minimized, as well as an irregular topography, both of which require a greater depth-of-focus.

After deposition of second metallization layer 20, an optional heat treatment step can be carried out to anneal both isolated contact plug 19 and second metallization layer 20.

Figure 5:
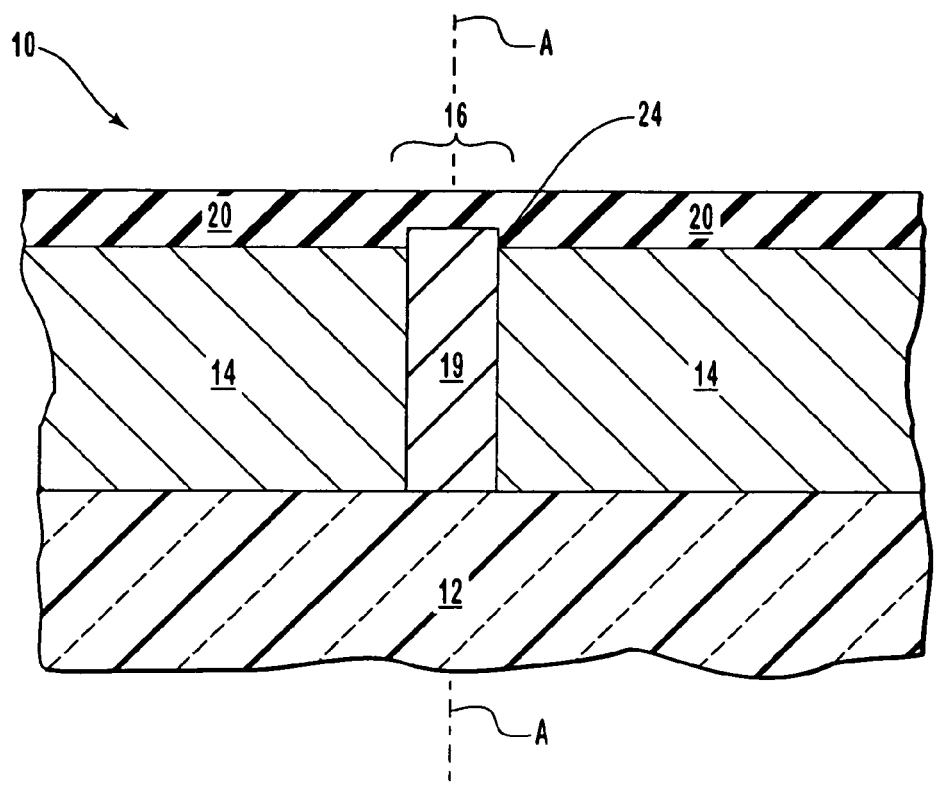
FIG. 5 is a cross-sectional view of the structure seen in FIG. 3, and further illustrates a partial etch of the insulation layer below the extent of the plug and thereby exposing lateral surfaces below the top surface thereof, followed by the formation of a second metal layer over the insulation layer and over the top and exposed lateral surfaces of the plug, the top surface of the second metal layer having been planarized to a preferred thickness suitable for metallization lines.
Figure 6:
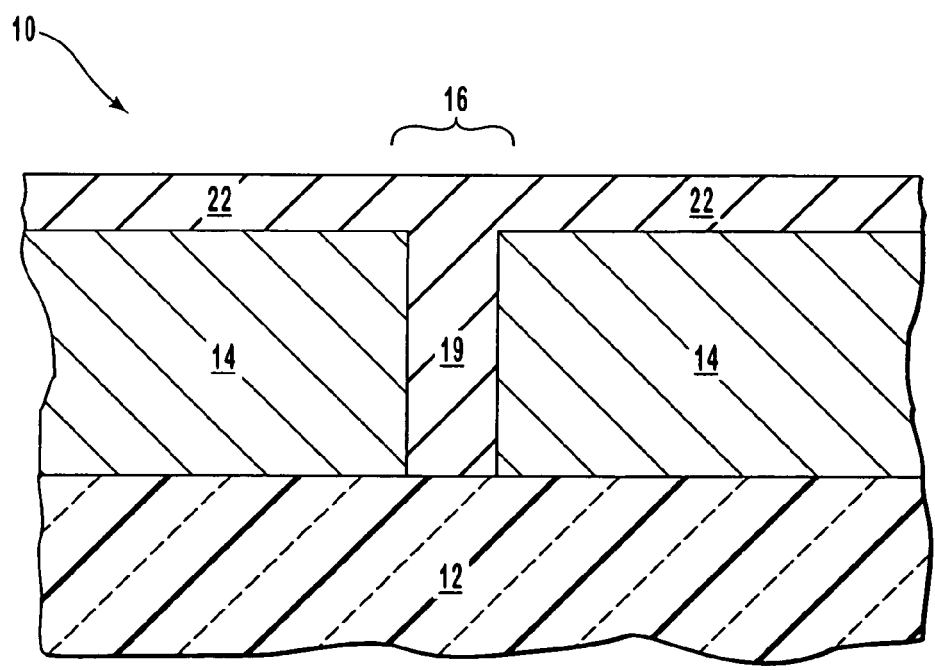
FIG. 6 is a cross-sectional view of a planarized insulation layer having therein a contact hole, the insulation layer being situated on a semiconductor substrate, and a metallization layer being disposed upon the insulation layer over the contact hole filled by the metallization layer, the metallization layer having been planarized above the insulation layer to a preferred thickness suitable for metallization lines.

Another method of the present invention, illustrated in FIG. 6, involves forming sole metallization layer 22 upon insulation layer 14. If sole metallization layer 22 does not fill contact hole 16 when it is formed, procedures for filling contact hole 16 are implemented as described above. Planarization of sole metallization layer 22, such as by a mechanical or chemical-mechanical planarization process, is then undertaken. Planarization of sole metallization layer 22, however, does not expose insulation layer 14, but rather achieves a desired thickness upon insulation layer 14. Planarized sole metallization layer 22 and contact plug 19 are an integral structure, thus providing for one less metal-to-metal interface when compared with the structure seen in FIGS. 4 and 5. Few metal-to-metal interfaces will correspondingly reduce resistance to current flow, in that a metal-to-metal interface may have discontinuities that cause resistance at the interface to be higher, which in turn causes the inherent inefficiency of Joule heating to occur.

Another method of the present invention involves diffusive heat treating of isolated contact plug and second metallization layer 20. The procedures as set forth above for FIGS. 1-5 are followed. For first metallization layer 18, specific alloys are selected that allow for substantially complete filling of contact hole 16. In the case of second metallization layer 20, specific alloys are selected that allow for an excess of a preferred alloying element to be present. After the selection and use of the selected specific alloys in first and second metallization layers 18, 20, a heat treatment step is carried out following the formation of second metallization layer 20. The heat treatment is conducted for a time period sufficient to allow a selected amount of a preferred alloying element to diffuse from a region of higher concentration within second metallization layer 20 to a region of lower concentration in isolated contact plug 19.

The foregoing diffusion method can have the alternative of causing the diffusion from isolated contact plug 19 into second metallization layer 20. For example, where first metallization layer 18 has sufficient ductility qualities to substantially fill contact hole 16, but responds poorly to planarization, diffusion of a preferred alloying element from isolated contact plug 19 into second metallization layer 20 will create a substantially uniform concentration gradient profile of a preferred alloying element, but will not have affected the second planarization process of second metallization layer 20.

FIG. 4 illustrates, in the graph seen therein, one result of the diffusion methods set forth above. The result of the heat treatment and its induced diffusion is that a substantially uniform concentration gradient of the preferred alloying element is exhibited at an interface B between isolated contact plug 19 and second metallization layer 20. The graph in FIG. 4 illustrates this substantially uniform concentration gradient of a preferred alloying element taken along the line A-A and including interface B. The graph depicts distance (X) from semiconductor substrate 12 toward second metallization layer 20 with respect to concentration (Y) of a preferred alloying element. In this embodiment, diffusion is illustrated as having proceeded from second metallization layer 20 into isolated contact plug 19. Diffusion, however, can also proceed from isolated contact plug 19 into second metallization layer 20.

A substantially uniform concentration gradient of a preferred alloying element can have various qualities. One quality is the reduction of electromigration when pure aluminum is used for both first metallization layer 18 and contact plug 19. The problem of electromigration of aluminum can be reduced in its effect when the alloying element is selected from the group of elements that resists aluminum electromigration, such as copper, silicon, titanium and other equivalents known in the art and achievable by routine experimentation.

Another quality is resistance to metal creep that is normally caused by physically interfaced metals of disparate thermal expansion coefficients. By causing a substantially uniform concentration gradient of a preferred alloying element between isolated contact plug 19 and second metallization layer 20, the tendency for metal creep is lessened as the composition at interface B, seen in FIG. 4, can be substantially the same on both sides of interface B. Alternatively the composition on either side of interface B can be of two different types but with substantially equivalent coefficients of thermal expansion at B.

Another quality achieved in methods of the present invention is the avoidance of creating large and irregular grain structures in the metallization. These problematic grain structures are avoided when lower processing temperatures, such as those required for aluminum or a lightly doped aluminum alloy, are used to fill contact hole 16. Because aluminum has a melting point of about 660° C., substantially lower than that of tungsten (3,370° C.) or titanium (1,800° C.), achieving ductility sufficient to cause pressure or reflow contact hole filling comes at significantly lower temperatures. For example, aluminum alone has a melting point that is about 26 percent that of tungsten, copper, about 37 percent, and silicon, about 46 percent. Adding preferred amounts of copper and/or silicon alloying elements does not significantly cause the pressure fill or reflow temperatures to materially approach those required of a titanium plug fill (about 57 percent of tungsten) or of a tungsten plug fill.

By maintaining lower temperatures, metal lines do not have the opportunity to form large or irregular grain structures. Such structures inhibit both metal reflow and planarization and are, therefore, to be avoided.

Another method of the present invention is illustrated in FIG. 6. This method involves etching first metallization layer 18 to expose insulation layer 14, and then exposing lateral surfaces 24 of isolated contact plug 19. This method can be carried out by a single planarizing step, such as mechanical or chemical mechanical planarization, that will remove insulation layer 14 faster than first metallization layer 18 is removed, with some of each being removed by the planarizing step. When a chemical mechanical planarization step is used, the chemistry thereof requires that physically shearable surfaces are created in both first metallization layer 18 and in insulation layer 14, but that between these two, the etch is more selective to first metallization layer 18 than insulation layer 14. An alternative to achieve the same structure with exposed lateral surfaces 24 is to stop on insulation layer 14 in a CMP step and conduct a second etch that is selective to isolated contact plug 19.

By maintaining lower temperatures, metal lines do not have the opportunity to form large or irregular grain structures. Such structures inhibit both metal reflow and planarization and are therefore to be avoided.

Another method of the present invention is illustrated in FIG. 6. This method involves etching first metallization layer 18 to expose insulation layer 14, and then exposing lateral surfaces 24 of isolated contact plug 19. This method can be carried out by a single planarizing step, such as mechanical or chemical mechanical planarization, that will remove insulation layer 14 faster than first metallization layer 18 is removed, with some of each being removed by the planarizing step. When a chemical mechanical planarization step is used, the chemistry thereof requires that physically shearable surfaces are created in both first metallization layer 18 and in insulation layer 14, but that between these two the etch is more selective to first metallization layer 18 than insulation layer 14. An alternative to achieve the same structure with exposed lateral surfaces 24 is to stop on insulation layer 14 in a CMP step and conduct a second etch that is selective to isolated contact plug 19.

The methods illustrated in FIGS. 1-7 can be modified by forming a refractory metal nitride lining 26 and a refractory metal silicide layer 30 at an interface between contact plug 19 and semiconductor substrate 12. This modification allows the use of materials other than aluminum for forming contact plug 19. In one embodiment, a tungsten plug is formed. In so doing, a refractory metal nitride is deposited in contact hole 16 lining the sides of contact hole 16. The refractory metal nitride is then annealed. In the case where semiconductor substrate 12 comprises a silicon substrate, a refractory metal silicide layer 30 is formed at the bottom of contact hole 16 upon semiconductor substrate 12. The anneal also improves the barrier properties of the refractory metal nitride, which prevents diffusion and chemical attack of the chemistry used to deposit the tungsten or other conductive material. Tungsten is then deposited to form contact plug 19. The steps of depositing first metallization layer 18 follow with variations as proposed above with respect to FIGS. 1-8.

Figure 7:
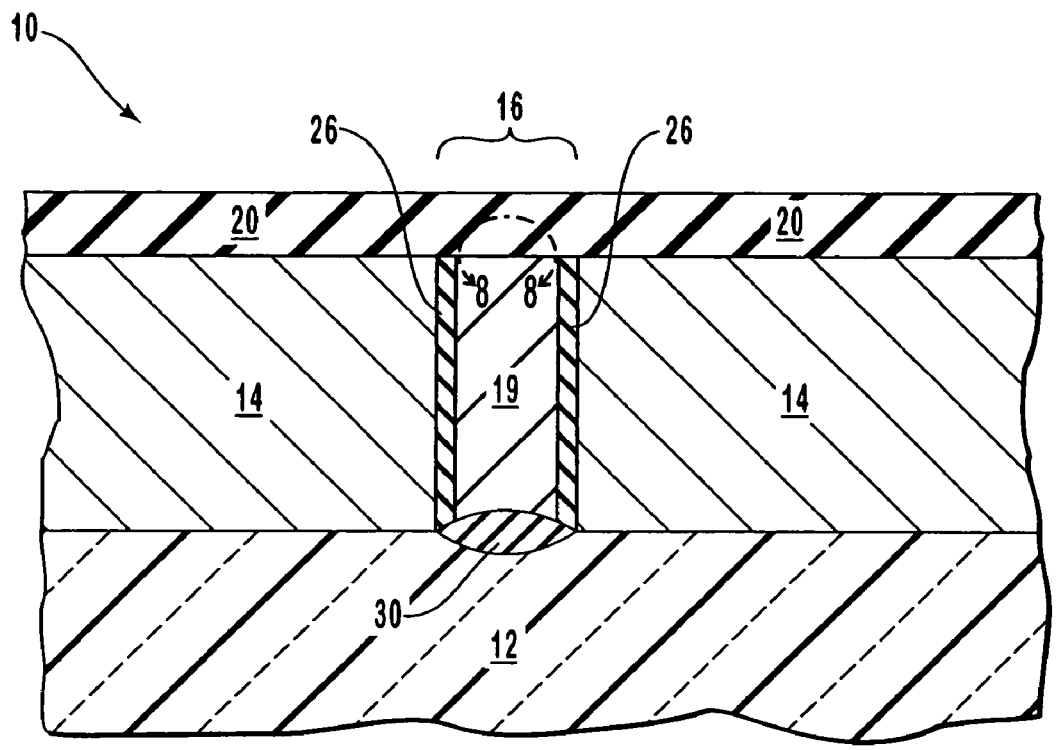
FIG. 7 is a cross-sectional view of the structure seen in FIG. 3, and further illustrates a refractory metal silicide layer at the bottom of the contact hole, the contact hole being lined by a refractory metal nitride layer, the plug being in contact with both the refractory metal silicide layer and the refractory metal nitride layer, and a second metal layer over the insulation layer and over the top of the plug, the refractory metal silicide layer, and the refractory metal nitride layer, the top surface of the second metal layer having been planarized to a preferred thickness suitable for metallization
Figure 8:
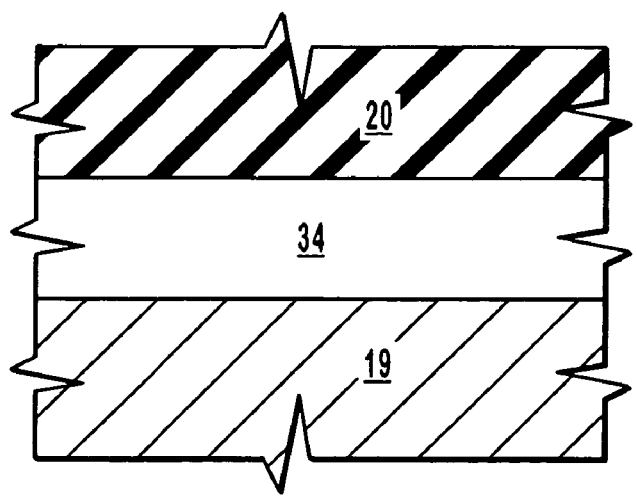
FIG. 8 is a section taken along the line 8-8 from FIG. 7 in which the contact plug has a second end opposite the first end in contact with the refractory metal silicide layer at the bottom of the contact hole; the second end is in contact with a second refractory metal silicide layer, the second refractory metal silicide layer being in contact with the metallization line.

The present invention also includes a contact plug and metallization line structure according to FIGS. 7 and 8. The contact plug and metallization line structure includes semiconductor substrate 12 having a contact surface thereon. It also includes insulation layer 14 having contact hole 16 therethrough extending to the contact surface of semiconductor substrate 12. Additionally, it includes contact plug 19 substantially composed of a first metal and situated in contact hole 16, contact plug 19 being electrically insulated by insulation layer 14. Second metallization layer 20 is substantially composed of a second metal, wherein contact plug 19 and second metallization layer 20 are electrically connected and have a substantially continuous composition gradient of a selected alloying element between the first metal and the second metal. The contact surface of semiconductor substrate 12 has first refractory metal silicide layer 30 thereon in contact with a first end of the plug 19. Contact hole 16 has an inside wall upon which a refractory metal nitride layer is situated in contact with the insulation layer and the plug. Additionally, contact plug 19 has a second end opposite the first end and in contact with a second refractory metal silicide layer 34 as seen in FIG. 8. Second refractory metal silicide layer 34 is in contact with second metallization layer 20.

The present invention also includes a contact plug and metallization line structure. The contact plug and metallization line structure includes semiconductor substrate 12 having situated thereon a silicon layer with a contact surface thereon. It also includes insulation layer 14 of BPSG on the silicon layer. Additionally, it includes contact hole 16 extending through insulation layer 14 of BPSG to the contact surface on the silicon layer. In addition thereto, it includes a refractory metal silicide layer 30 of titanium silicide on the contact surface of the silicon layer. Additionally, it includes refractory metal nitride lining 26 of titanium nitride on a sidewall of contact hole 16. Contact plug 19 is substantially composed of a first metal selected from the group consisting of Al, AlCu, and AlSiCu, and being situated in contact hole 16. Contact plug 19 is in contact, at an end thereof, with refractory metal silicide layer 30 of titanium silicide. Contact plug 19 has a sidewall in contact with refractory metal nitride lining 26 of titanium nitride, and contact plug 19 is electrically insulated by insulation layer 14 of BPSG. Second metallization layer 20 is substantially composed of a second metal selected from the group consisting of Al, AlCu, and AlSiCu. One of the first and second metals has a higher concentration of Cu than the other of the first and second metals. Contact plug 19 and second metallization layer 20 are electrically connected and have a substantially continuous composition gradient of a selected alloying element between the first metal and the second metal, second metallization layer 20 having a substantially planar top surface. Contact plug 19 has first and second opposite ends each of which is in contact with refractory metal silicide materials 30, 34, respectively.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A method for forming a contact electrically connected to a metal line, comprising:
    forming an insulation layer situated on a semiconductor substrate;
    forming a contact hole in the insulation layer to expose a contact surface on the semiconductor substrate;
    forming a silicide layer on the contact surface of the semiconductor substrate;
    forming a metal nitride layer upon a sidewall of the contact hole;
    forming a refractory metal nitride layer upon a sidewall of the contact hole; and
    forming a single layer of metal having a substantially planar top surface upon a top planar surface of the insulation layer, the single layer of metal substantially filling the contact hole and in physical contact with the silicide layer and the metal nitride layer.

2. The method of claim 1, wherein the insulation layer comprises a material selected from the group consisting of TEOS, doped silicon dioxide, BPSG, PSG, BSG, and silicon nitride.

3. The method of claim 1, wherein the insulation layer comprises a material selected from the group consisting of oxides, nitrides, carbides, carbon nitrides, and oxynitrides.

4. The method of claim 1, wherein forming a single layer of metal having a substantially planar top surface upon a top planar surface of the insulation layer composes:
    planarizing the insulation layer to form the top planar surface of the insulation layer;

depositing the single layer of metal upon the top planar surface of the insulation layer, the single layer of metal having a selected thickness;

treating the semiconductor substrate in an environment of a selected pressure range and a selected temperature range so as to cause the single Layer of metal to substantially fill the contact hole;

planarizing the single layer of metal; and forming a metal line having a selected shape from the single layer of metal.

5. The method of claim 4, wherein forming a metal line having a selected shape from the single layer of metal comprises patterning and etching the single layer of metal into the metal line having the selected shape.

6. The method of claim 1, wherein forming a single layer of metal comprises forming the single layer of metal by a deposition process selected from the group consisting of PVD, CVD, electroplating, and electroless plating.

7. A method for forming a contact electrically connected to a metal line, comprising:

forming an insulation layer situated on a silicon layer upon a semiconductor substrate;

forming a contact hole in the insulation layer to expose a contact surface on the silicon layer;

forming a refractory metal silicide layer within the contact hole upon the silicon layer;

forming a refractory metal nitride layer upon a sidewall of the contact hole in contact with the insulation layer;

depositing a single layer of metal upon the insulation layer and in contact with both the refractory metal silicide layer and the refractory metal nitride layer; and treating the semiconductor substrate in an environment of a selected pressure range and a selected temperature range so as to cause the single layer of metal to substantially fill the contact hole.

8. The method of claim 7, further comprising:

planarizing the single layer of metal; and patterning and etching the single layer of metal into a metal line having a selected shape.

9. The method of claim 7, wherein depositing a single layer of metal comprises depositing the single layer of metal comprising a material selected from the group consisting of Al, AlCu, and AlCuSi, and wherein forming an insulation layer comprises forming the insulation layer comprising a material selected from the group consisting of TEOS, doped silicon dioxide, BPSG, PSG. BSG, and silicon nitride.

10. A contact plug and metallization line structure comprising:

a semiconductor substrate having a contact surface thereon;

an insulation layer having a contact hole therethrough extending to the contact surface on the semiconductor substrate;

a plug comprised of a first metal and situated in the contact hole, the plug being electrically insulated by the insulation layer; and a metallization line comprised of a second metal, wherein the plug and the metallization line are electrically connected and have a substantially continuous composition gradient of a selected alloying element between the first metal and the second metal;

wherein the contact surface has a first refractory metal silicide layer thereon in contact with a first end of the plug.

11. The contact plug and metallization line structure of claim 10, wherein each of the first and second metals is selected from the group consisting of Al, AlCu, and AlSiCu, and wherein one of the first and second metals has a higher concentration of Cu than the other of the first and second metals.

12. The contact plug and metallization line structure of claim 10, wherein the first and second metals have substantially the same composition.

13. The contact plug and metaltization line structure of claim 10, wherein the plug has a second end opposite the first end and in contact with a second refractory metal silicide layer, the second refractory metal silicide layer being in contact with the metallization line.

14. A contact plug and metallization line structure comprising:

a semiconductor substrate having a contact surface thereon;

an insulation layer comprising a doped oxide of silicon and having a contact hole therethrough extending to the contact surface on the semiconductor substrate;

a plug comprised of a first metal and situated in the contact hole, the first metal being selected from the group consisting of aluminum and alloys thereot the plug being electrically insulated by the insulation layer; and a metallization line comprised of a second metal, the second metal being selected from the group consisting of aluminum and alloys thereof, wherein the plug and the metallization line are electrically connected and have a substantially continuous composition gradient of a selected alloying element between the first metal and the second metal;

wherein the contact surface has a first refractory metal silicide layer thereon in contact with a first end of the plug.

15. The contact plug and metallization line structure of claim 14, wherein the first and second metals comprise a material selected from the group consisting of AlSi, AlTi, AlAg, AlAu, AlMn, AlNa, AlW, AlCuZn, and AlNi.

16. The contact plug and metallization line structure of claim 14, wherein the insulation layer comprises a material selected from the group consisting of oxides, nitrides, carbides, carbon nitrides, and oxynitrides.

17. The method according to claim 1, wherein the single layer of metal comprises a material selected from the group consisting of AlAg, AlAu, AlMn, AlNa, AlW, AlCuZn, and AlNi.

* * * * *

UNITED STATES PATENT AND TRADEMARK OFFICE
CERTIFICATE OF CORRECTION

PATENT NO. : 7,294,570 B2 Page 1 of 1
APPLICATION NO. : 10/812117
DATED : November 13, 2007
INVENTOR(S) : Elliott et al.

It is certified that error appears in the above-identified patent and that said Letters Patent is hereby corrected as shown below:

In column 10, line 65, in Claim 4, delete "composes:" and insert -- comprises: --, therefor.

In column 11, line 6, in Claim 4, delete "Layer" and insert -- layer --, therefor.

In column 11, line 46, in Claim 9, after "PSG" delete "." and insert -- , --, therefor.

In column 12, line 16, in Claim 13, delete "metaltization" and insert -- metallization --, therefor.

In column 12, line 31, in Claim 14, delete "thereot" and insert -- thereof, --, therefor.

Signed and Sealed this

First Day of April, 2008

JON W. DUDAS
*Director of the United States Patent and Trademark Office*